US008866059B2

(12) United States Patent
Murata et al.

(10) Patent No.: US 8,866,059 B2
(45) Date of Patent: Oct. 21, 2014

(54) SOLID STATE IMAGING DEVICE AND DIFFERENTIAL CIRCUIT HAVING AN EXPANDED DYNAMIC RANGE

(75) Inventors: Takahiko Murata, Osaka (JP); Takayoshi Yamada, Osaka (JP); Yoshihisa Kato, Shiga (JP); Shigetaka Kasuga, Osaka (JP); Mitsuyoshi Mori, Kyoto (JP)

(73) Assignee: Panasonic Corporation, Osaka (JP)

( * ) Notice: Subject to any disclaimer, the term of this patent is extended or adjusted under 35 U.S.C. 154(b) by 690 days.

(21) Appl. No.: 13/055,863

(22) PCT Filed: Jul. 23, 2009

(86) PCT No.: PCT/JP2009/003474
§ 371 (c)(1),
(2), (4) Date: Jan. 25, 2011

(87) PCT Pub. No.: WO2010/013417
PCT Pub. Date: Feb. 4, 2010

(65) Prior Publication Data
US 2011/0121162 A1    May 26, 2011

(30) Foreign Application Priority Data

Jul. 29, 2008    (JP) ................................. 2008-195374

(51) Int. Cl.
*H01L 27/00*    (2006.01)
*H01L 27/146*    (2006.01)
*H04N 5/235*    (2006.01)
*H04N 5/355*    (2011.01)

(52) U.S. Cl.
CPC .... *H01L 27/14603* (2013.01); *H01L 27/14643* (2013.01); *H01L 27/14645* (2013.01); *H04N 5/2355* (2013.01); *H04N 5/35572* (2013.01); *H04N 5/3559* (2013.01)
USPC ..................... 250/208.1; 250/214.1; 345/297; 345/302; 257/431

(58) Field of Classification Search
USPC ..... 250/208.1, 214.1, 214 R, 214 DC, 214 C; 348/297, 298, 281, 302, 311; 257/431, 257/443
See application file for complete search history.

(56) References Cited

U.S. PATENT DOCUMENTS 6,480,226 B1 * 11/2002 Takahashi et al. ............ 348/296
6,791,612 B1    9/2004 Hwang (Continued)

FOREIGN PATENT DOCUMENTS

| JP | 2003-134396 | 5/2003 |
|----|-------------|--------|
| JP | 2004-111488 | 4/2004 |
| JP | 2006-245522 | 9/2006 |
| JP | 2008-148082 | 6/2008 |

*Primary Examiner* — Francis M Legasse, Jr.
(74) *Attorney, Agent, or Firm* — McDermott Will & Emery LLP

(57) ABSTRACT

A solid-state imaging device that is configurable into a small size appropriate for expanding dynamic range includes: a photodiode which is a photoelectric conversion unit that generates charge by incident light; a MOS transistor which is connected to the photodiode and transfers the charge; a floating diffusion region which is a first accumulation unit which accumulates the charge via the MOS transistor; a MOS transistor which is a second transfer unit connected to the floating diffusion region and connected in series to the MOS transistor; and a MOS transistor which is an output unit which outputs, via the MOS transistor, a signal voltage in accordance with an amount of the charge.

9 Claims, 12 Drawing Sheets

(56) References Cited

U.S. PATENT DOCUMENTS

| | | | |
|---|---|---|---|
| 7,755,018 B2 * | 7/2010 | Barna et al. | 250/208.1 |
| 2006/0284054 A1 * | 12/2006 | Asaba | 250/214.1 |
| 2008/0007638 A1 | 1/2008 | Aoki et al. | |
| 2008/0018763 A1 | 1/2008 | Sato | |
| 2009/0045319 A1 | 2/2009 | Sugawa et al. | |

* cited by examiner

SOLID STATE IMAGING DEVICE AND DIFFERENTIAL CIRCUIT HAVING AN EXPANDED DYNAMIC RANGE

TECHNICAL FIELD

The present invention relates to a solid-state imaging device used in a digital camera, and relates particularly to a technique of expanding dynamic range of the solid-state imaging device.

BACKGROUND ART

Conventionally, a complementary MOS (CMOS) solid-state imaging device which is already in practical use reads charge that is accumulated in a photodiode included in each pixel through an amplifying circuit including a metal oxide semiconductor (MOS) transistor.

The CMOS solid-state imaging device can be driven with low voltage and low power consumption, and is particularly used as an image input device for a cellular phone. Furthermore, in recent years, the CMOS solid-state imaging device has been incorporated in a monitoring camera and an in-vehicle camera.

A general dynamic range (a ratio between maximum intensity and minimum intensity of incident light to which an output is responsive) of the CMOS solid-state imaging device is approximately 60 dB to 80 dB, and it is expected to expand the dynamic range to approximately 100 dB to 120 dB which is comparable to a naked human eye or silver salt film. Particularly, it is further expected to expand the dynamic range when using the CMOS solid-state imaging device in the in-vehicle camera, the monitoring camera, or the like which requires capturing a recognizable image of an entire object having brightness significantly different from portion to portion.

To meet this demand, there are some known techniques of expanding the dynamic range by accumulating, in a large-volume capacitor, the charge generated in a light-receiving element (for example, see Patent Literature 1 and Patent Literature 2).

FIG. 1 is a circuit diagram showing a pixel circuit of a solid-state imaging device disclosed in Patent Literature 1.

The pixel circuit shown in FIG. 1 includes: a photodiode PD; a parasitic capacitor of a photodiode PD, or a capacitor C1 that is intentionally formed; a reset transistor M1; a transfer switch M2; a selection switch M4; a source follower transistor M6; a capacitor C2 which is a gate-source capacitor of the source follower transistor M6; a transfer switch M3; a selection switch M5; a source follower transistor M7; and a capacitor C3 which is a gate-source capacitor of the source follower transistor M7.

This configuration allows the charge accumulated in the photodiode PD and the capacitor C1 to be output via two paths: a first path via the source follower transistor M6 and a second path via the source follower transistor M7.

The pixel circuit shown in FIG. 1 can expand the dynamic range as follows.

First, the charge accumulated in the photodiode PD and the capacitor C1 is discharged to a supply of reset voltage VR via the reset transistor M1.

During a charge accumulation period, the charge generated by incident light on the photodiode PD is accumulated in the photodiode PD and the capacitor C1.

When turning on the transfer switch M2 and the transfer switch M3, the voltage of each of the capacitor C2 and the capacitor C3 varies according to the amount of charge accumulated in the photodiode PD and the capacitor C1.

Assuming, as an example, a gate size of the source follower transistor M6 as W=1 μm, L=1 μm, and a gate size of the source follower transistor M7 as W=10 μm, L=10 μm, the gate-source capacitance of the source follower transistor M7 is ten times larger than the gate-source capacitance of the source follower transistor M6. Accordingly, the capacitance of the capacitor C3 is ten times larger than the capacitance of the capacitor C2.

Accordingly, turning on the transfer switch M3 expands the dynamic range by ten times compared to the case of turning on the transfer switch M2.

FIG. 2 is a circuit diagram showing a pixel circuit of a solid-state imaging device disclosed in Patent Literature 2.

The pixel circuit shown in FIG. 2 includes: a photoelectric conversion unit (hereinafter, described as a PD unit) 371; a transfer transistor 372 which is provided adjacent to the PD unit 371 and transfers photocharge; a diffusion region (hereinafter described as an FD region) 373 provided in connection with the PD unit 371 via the transfer transistor 372); a first capacitor 374 and a second capacitor 375 which accumulate a charge overflowing from the PD unit 371 during a charge accumulating operation; a reset transistor 376 which is provided in connection with the first capacitor 374 and discharges the signal charge from the first capacitor 374, the second capacitor 375, and the FD region 373; a first accumulation transistor 377 provided between the FD region 373 and the first capacitor 374; a second accumulation transistor 378 provided between the first capacitor 374 and the second capacitor 375; an amplifying transistor 379 which reads, as voltage fluctuation, the signal charge accumulated in the FD region 373, or the signal charge accumulated in the FD region 373 and the first capacitor 374, or the signal charge accumulated in the FD region 373, the first capacitor 374, and the second capacitor 375; and a selection transistor 380 which is provided in connection with the amplifying transistor 379 and selects the pixel or a pixel block including the pixel.

The pixel circuit shown in FIG. 2 can expand dynamic range as follows.

First, prior to charge accumulation, the first accumulation transistor 377 and the second accumulation transistor 378 are turned on, and the transfer transistor 372 and the reset transistor 376 are turned off. Subsequently, with the reset transistor 376 and the transfer transistor 372 held in an On-state, the FD region 373 and the first and second capacitors 374 and 375 are reset.

Subsequently, a first noise charge N1, which is introduced into the FD region 373, the first capacitor 374, and the second capacitor 375 after turning off the reset transistor 376, is read out. In the reading, the first noise charge N1 includes a fixed pattern noise component derived from a threshold voltage of the amplifying transistor 379.

Subsequently, with the second accumulation transistor 378 held in an Off-state, the signal charge accumulated in the FD region 373, the first capacitor 374, and the second capacitor 375 is distributed according to a capacitance ratio between the FD region 373, the first capacitor 374, and the second capacitor 375.

Of the distributed charges, a second noise charge N2, which is distributed to the FD region 373 and the first capacitor 374, is read out. In the reading, the second noise charge N2 also includes a fixed-pattern noise component derived from the threshold voltage of the amplifying transistor 379.

Subsequently, during the charge accumulation period, with the first accumulation transistor 377 held in the On-state and the second accumulation transistor 378, the reset transistor 376, and the selection transistor 380 held in the Off-state, the charge is accumulated in the PD unit 371, and an excess amount of the generated charge which exceeds a maximum charge accumulation amount of the PD unit 371 is added to the noise charge N2 and accumulated in the FD region 373 and the first capacitor 374, via the transfer transistor 372 and the first accumulation transistor 377.

Furthermore, the charge exceeding the maximum charge accumulation amount of the PD unit 371 and the first capacitor 374 is accumulated in the second capacitor 375 via the second accumulation transistor 378.

This operation allows the charge overflowing from the PD unit 371 to be accumulated in another capacitor, so that the dynamic range is expanded.

Subsequently, after completion of the charge accumulation period, with the selection transistor 380 held in the On-state and the first accumulation transistor 377 held in the Off-state, the charge accumulated in the FD region 373 and the first capacitor 374 is distributed according to the capacitance ratio between the FD region 373 and the first capacitor 374.

Subsequently, a signal charge N3 distributed to the FD region 373 is read out. In the reading, the signal charge N3 also includes a fixed pattern noise component derived from the threshold voltage of the amplifying transistor 379.

Subsequently, with the transfer transistor 372 held in the On-state, the charge accumulated in the PD unit 371 is transferred to the FD region 373, and a signal charge S1 in the FD region 373 is added to the signal charge N3, to be read out.

Subsequently, with the first accumulation transistor 377 held in the On-state, the signal charge S1 in the FD region 373 and the signal charge S2 in the first capacitor 374 are mixed to be read out. Subsequently, with the second accumulation transistor 378 held in the On-state, the signal charge S1 in the FD region 373, the signal charge S2 in the first capacitor 374, and the signal charge S3 in the second capacitor 375 are mixed to be read out.

Subsequently, with the reset transistor 376 held in the Off-state, the FD region 373, the first capacitor 374, and the second capacitor 375 are reset.

A solid-state imaging device as disclosed in Patent Literature 2 expands dynamic range using a pixel circuit which keeps a high aperture ratio, by detecting the signal charge from each pixel by repeating the operation described above.

CITATION LIST

Patent Literature

[PTL 1] Japanese Unexamined Patent Application Publication No. 2003-134396
[PTL 2] Japanese Unexamined Patent Application Publication No. 2006-245522

SUMMARY OF INVENTION

Technical Problem

However, Patent Literature 1 discloses a technique of expanding dynamic range by increasing the gate-source capacitances of the source follower transistors M6 and M7. Thus, to increase the dynamic range, it is necessary to increase gate size, which causes, as a result, a problem of increase in chip size in the solid-state imaging device.

In addition, the technique disclosed in Patent Literature 2 has the following problem.

During the charge accumulation period of the PD unit 371, a predetermined voltage is applied to the FD region 373. In addition, the n-type impurity concentration of the configuration of the FD region 373 is higher than that of the PD unit 371, and a contact is formed to connect a gate electrode of the amplifying transistor 379 and a diffusion layer of the FD region 373. Thus, during the charge accumulation period, leakage current causes a decline in hold voltage of the FD region 373, which makes it difficult to perform a complete transfer of the accumulated charge from the PD unit 371 to the FD region 373, and causes, as a result, a problem of occurrence of afterimage.

In addition, a predetermined voltage is also applied to the FD region 373, the first capacitor 374, and the second capacitor 375 which accumulate the charge leaking from the PD unit 371, and the FD region 373 includes a diffusion layer including a high-concentration n-type impurity, and is connected to a contact including a metal material. With this, an inflow of charge caused by leakage current reduces the capacitances of the FD region 373, the first capacitor 374, and the second capacitor 375 for accumulating the charge from the PD unit 371. This results in a problem of insufficient expansion of dynamic range.

In addition, due to the configuration in which a charge leakage from the PD unit 371 is accumulated in the FD region 373, the first capacitor 374, and the second capacitor 375, the dynamic range is determined by the capacitances of such capacitors, that is, the amount of charge that can be accumulated by these capacitors. This causes another problem of insufficient expansion of dynamic range.

In addition, since one pixel needs to include three capacitors, that is, the FD region 373, the first capacitor 374, and the second capacitor 375, it is difficult to secure a sufficient aperture area that is an area of the PD unit 371, and this causes a problem of reduced sensitivity. In addition, since it is difficult to downsize the pixel, there is also a problem of difficulty in downsizing the chip size and forming a high-resolution imaging device.

The present invention is conceived to solve these problems, and it is an object of the present invention to provide a solid-state imaging device that is suited for expanding dynamic range and is configurable into a small size.

Solution to Problem

To achieve the above object, a solid-state imaging device according to an aspect of the present invention is a solid-state imaging device including a plurality of pixel circuits two-dimensionally arranged on a semiconductor substrate, and the solid-state imaging device includes: a photoelectric conversion unit which generates a charge from incident light; a first transfer unit which is connected to the photoelectric conversion unit and transfers the charge; a first accumulation unit which accumulates the charge via the first transfer unit; a second transfer unit connected to the first accumulation unit and connected in series to the first transfer unit; and an output unit which outputs a signal voltage that is a voltage according to an amount of the charge via the second transfer unit.

In addition, each of the first and second transfer units may include a MOS transistor, and a drain of the first transfer unit may be connected to a source of the second transfer unit.

In addition, the solid-state imaging device may further include a second reset unit which sets a voltage of a connection point between the second transfer unit and the output unit to a reset voltage, and the output unit may further output a reference voltage in a state where the reset voltage is applied to the connection point.

In addition, the photoelectric conversion unit, the transfer unit, the first accumulation unit, the second transfer unit, the output unit, and the second reset unit may be provided in each of the plurality of pixel circuits.

This allows continuously transferring the charge accumulated in the photoelectric conversion unit during different lengths of accumulation time, and allows outputting, via the second transfer unit, a result of the addition performed in the first accumulation unit, thus making it possible to realize expanding dynamic range by adding optical signal charges within the pixel circuit, without requiring a circuit for adding signals to be provided outside the solid-state imaging device.

In addition, preferably, the second transfer unit includes a MOS transistor, and the first accumulation unit has no contact with a metal material.

This makes it possible to decrease leakage current in the first accumulation unit.

In addition, the first transfer unit in each of the plurality of pixel circuits may transfer the charge generated in the photoelectric conversion unit to the first accumulation unit, the charge being generated from the incident light entering during a time period commonly determined for each of the plurality of pixel circuits.

This allows a global shutter operation.

In addition, the first transfer unit in each of the plurality of pixel circuits may transfer a plurality of charges generated in the photoelectric conversion unit to the first accumulation unit, the plurality of charges each being generated from the incident light entering during a corresponding one of a plurality of time periods commonly determined for each of the plurality of pixel circuits and having lengths different from each other, and the first accumulation unit may add and accumulate all the plurality of charges that are transferred.

This makes it possible to obtain an image signal having wide dynamic range.

In addition, the solid-state imaging device may further include: a differential circuit which detects a difference between the signal voltage and the reference voltage, and the differential circuit may include: a first capacitor and a second capacitor that are connected in series; and an initializing switch through which an initializing voltage that is predetermined is applied to a connection point between the first and second capacitors, and in a state where the initializing voltage is applied to the connection point, the differential circuit may hold a difference voltage in the first capacitor and the initializing voltage in the second capacitor, and may subsequently divide the reference voltage between the first and second capacitors, the difference voltage being a difference between the signal voltage and the initializing voltage.

In addition, preferably, the second capacitor includes a plurality of separate capacitors one of which can be selectively connected in series to the first capacitor, and all of which can be coupled in parallel, and the differential circuit may divide the reference voltage between the first capacitor and each of the plurality of separate capacitors and subsequently couple all of the plurality of separate capacitors in parallel.

This makes it possible to obtain a video signal of high output level with less noise.

In addition, the solid-state imaging device may further include: a second accumulation unit which is connected to a connection point between the second transfer unit and the output unit and accumulates the charge via the second transfer unit; a first reset unit which discharges the charge accumulated in the first accumulation unit; and a second reset unit which discharges the charge accumulated in the second accumulation unit, and the output unit may further output a reference voltage in a state where the charge accumulated in the second accumulation unit is discharged.

In addition, preferably, the first reset unit applies a first voltage to the first accumulation unit, the second reset unit applies a second voltage to the second accumulation unit, and a maximum value of the first voltage is equal to or lower than a maximum value of the second voltage.

This allows separately adjusting the voltage applied to the first accumulation unit and the voltage applied to the second accumulation unit, allows a complete charge transfer from the first accumulation unit to the second accumulation unit, and allows increasing the amount of accumulated charge as a result of increase in the applied voltage even when the area of the first accumulation unit is reduced, thus making it possible to realize a smaller solid-state imaging device that achieves high resolution and wide dynamic range.

In addition, preferably, a capacity of the photoelectric conversion unit is smaller than a capacity of the first accumulation unit.

This allows all the charges accumulated in the photoelectric conversion unit to be transferred to the first accumulation unit, thus making it possible to realize a solid-state imaging device that achieves high resolution and wide dynamic range.

In addition, preferably, a capacity of the first accumulation unit is equal to or smaller than a capacity of the second accumulation unit.

This allows all the charge accumulated in the first accumulation unit to be transferred to the second accumulation unit, thus making it possible to realize a solid-state imaging device that achieves high resolution and wide dynamic range.

In addition, the output unit has an amplifying transistor.

This allows the accumulated charge to be output from the photoelectric conversion unit included in the pixel circuit to the outside of the solid-state imaging device, thus making it possible to obtain an image.

In addition, the photoelectric conversion unit may include: a first region formed near a surface of the semiconductor substrate, the first region being of a first conductivity type; and a second region surrounding bottom and lateral sides of the first region, the second region being of a second conductivity type different from the first conductivity type, and a third region of the second conductivity type may be formed in a surface of a portion on which the first region is formed, the portion being included in the semiconductor substrate.

This decreases leakage current in and out of the photoelectric conversion unit and allows, concurrently with suppressing loss due to the leakage, transferring the charge generated in the photoelectric conversion unit to the first accumulation unit, thus making it possible to realize a solid-state imaging device that achieves high resolution and wide dynamic range.

In addition, the first accumulation unit may include: a fourth region formed near a surface of the semiconductor substrate, the fourth region being of a first conductivity type; and a fifth region surrounding bottom and lateral sides of the fourth region, the fifth region being of a second conductivity type different from the first conductivity type, and a sixth region of the second conductivity type may be formed in a surface of a portion on which the fourth region is formed, the portion being included in the semiconductor substrate.

This decreases leakage current in and out of the first accumulation unit and allows, concurrently with suppressing loss due to the leakage, transferring the charge generated in the photoelectric conversion unit to the first accumulation unit, thus making it possible to realize a solid-state imaging device that achieves high resolution and wide dynamic range.

In addition, the photoelectric conversion unit may include: a first region formed near a surface of the semiconductor substrate, the first region being of a first conductivity type; and a second region surrounding bottom and lateral sides of the first region, the second region being of a second conductivity type different from the first conductivity type, the first accumulation unit may include: a fourth region formed near the surface of the semiconductor substrate, the fourth region being of the first conductivity type; and a fifth region surrounding bottom and lateral sides of the fourth region, the fifth region being of the second conductivity type different from the first conductivity type, and an impurity concentration of the first region may be equal to or lower than an impurity concentration of the fourth region.

This decreases the leakage current in and out of the first accumulation unit, thus making it possible to realize a solid-state imaging device that achieves high resolution and wide dynamic range.

In addition, the present invention can be realized not only as such a solid-state imaging device but also as a differential circuit.

Advantageous Effects of Invention

A solid-state imaging device according to an implementation of the present invention includes: a photoelectric conversion unit which generates a charge from incident light; a first transfer unit which is connected to the photoelectric conversion unit and transfers the charge; a first accumulation unit which accumulates the charge via the first transfer unit; a second transfer unit connected to the first accumulation unit and connected in series to the first transfer unit, and thus, by continuously transferring to the first accumulation unit, the charges accumulated in the photoelectric conversion unit during a plurality of accumulation periods having different lengths, and outputting, via the second transfer unit, the result of the addition performed in the first accumulation unit, it is possible to realize a solid-state imaging device that allows expanding dynamic range, by adding optical signal charges within the pixel circuit, without requiring another circuit for adding the signals to be provided outside the solid-state imaging device.

DESCRIPTION OF EMBODIMENTS

Hereinafter, embodiments of the present invention will be described with reference to the drawings.

[Embodiment 1]

First, a solid-state imaging device according to a first embodiment of the present invention will be described.

Figure 1:
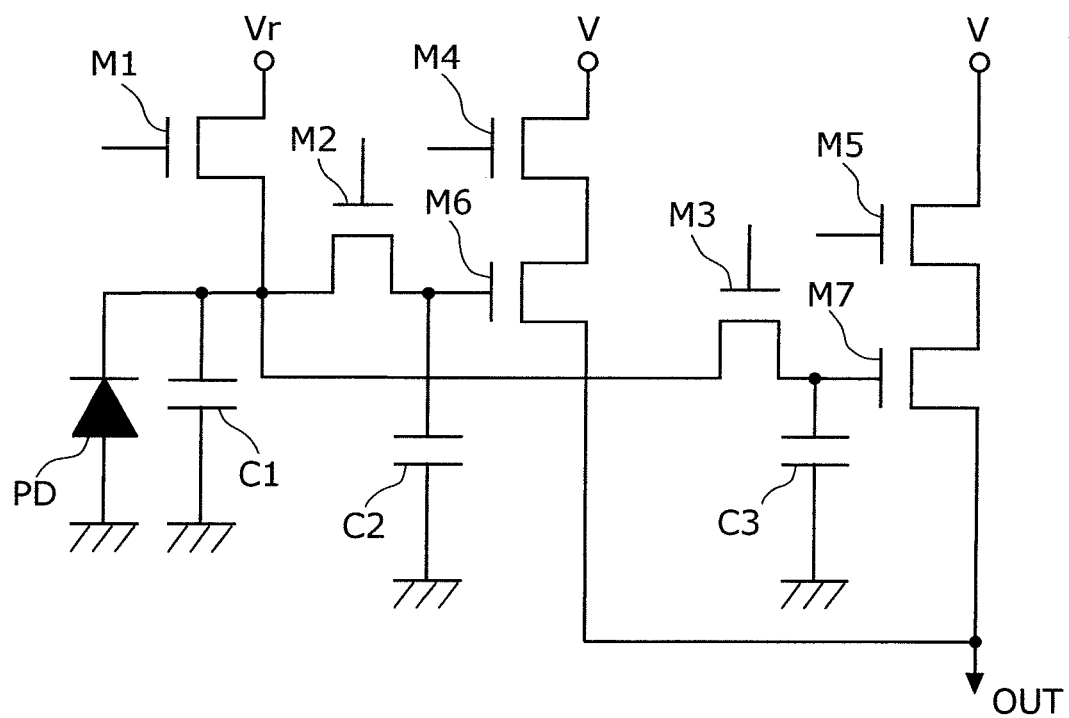
FIG. 1 is a circuit diagram showing a configuration of a main part of a conventional solid-state imaging device.
Figure 2:
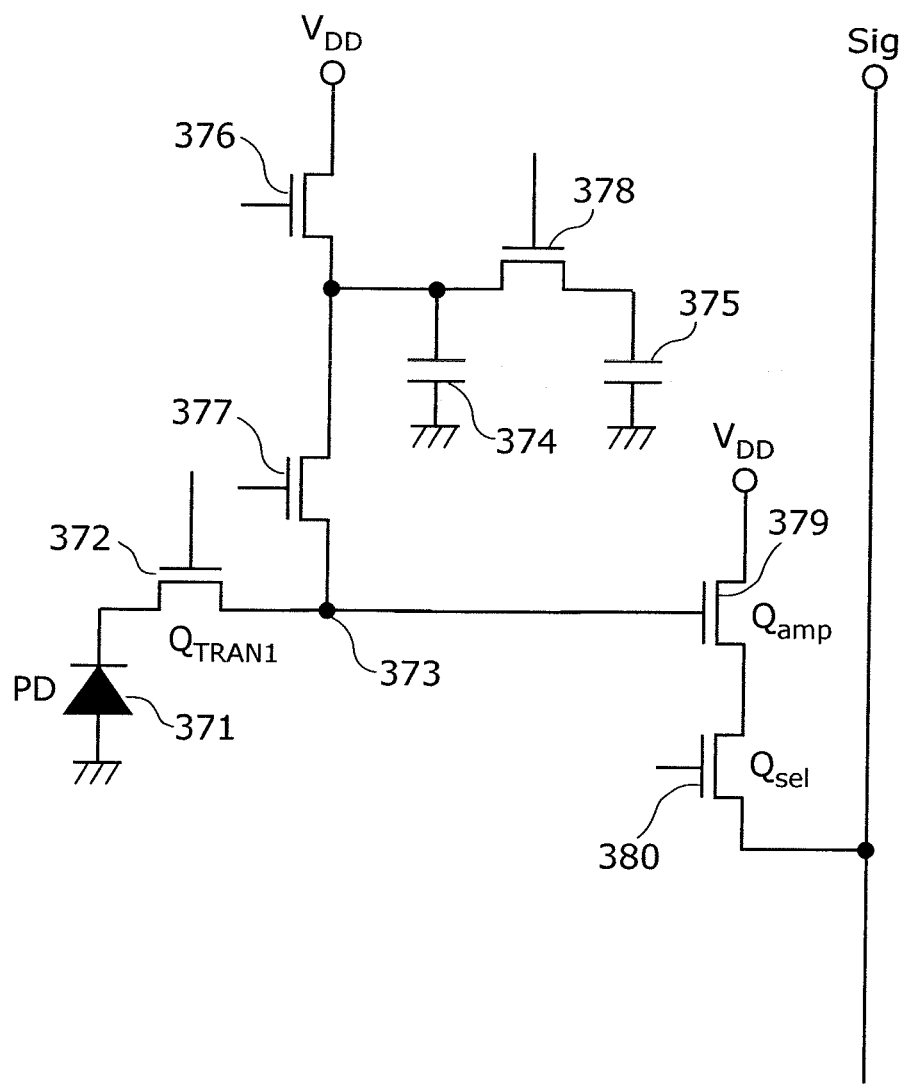
FIG. 2 is a circuit diagram showing a configuration of a main part of a conventional solid-state imaging device.
Figure 3:
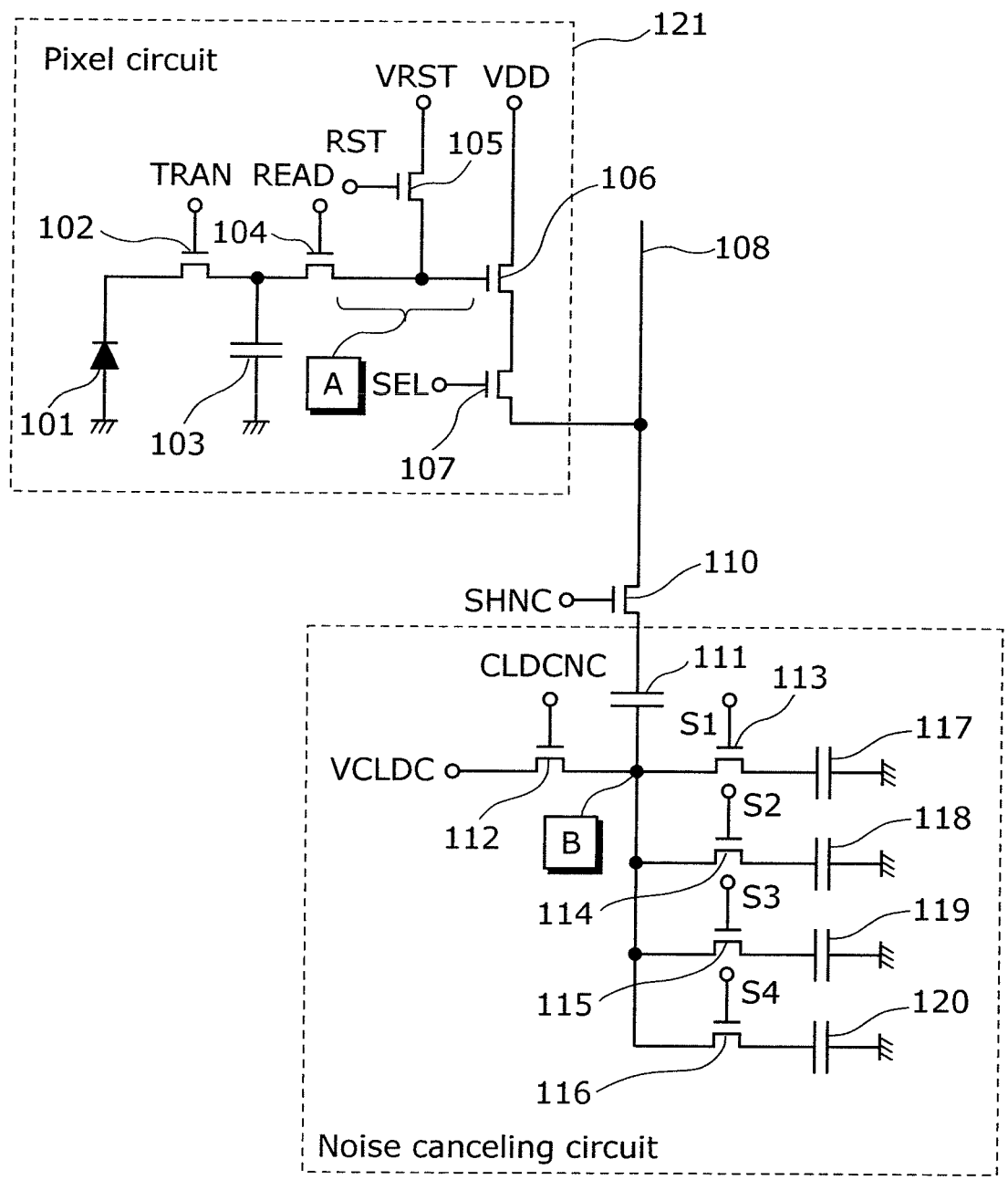
FIG. 3 is a circuit diagram showing a configuration of a main part of a solid-state imaging device according to a first embodiment of the present invention.

FIG. 3 is a circuit diagram showing a configuration of a main part of the solid-state imaging device according to the first embodiment.

A solid-state imaging device shown in FIG. 3 includes: a photodiode 101; metal oxide semiconductor (MOS) transistors 102, 104, 105, 106, 107, 110, 112, 113, 114, 115, and 116; capacitors 111, 117, 118, 119, and 120; a vertical common signal line 108; and a floating diffusion region 103.

The photodiode 101 is a light-receiving element which generates an optical signal charge according to light-receiving intensity and exposure time.

The MOS transistor 102 is an example of the first transfer unit, and is a charge transfer gate through which the signal charge generated in the photodiode 101 is transferred to the floating diffusion region 103. When the MOS transistor 102 is turned on, the charge generated in the photodiode 101 is transferred to the floating diffusion region 103. This generates a voltage according to the amount of the transferred charge and the capacitance of the floating diffusion region 103.

The MOS transistor 104 is an example of the second transfer unit, and is a switch through which the voltage generated in the floating diffusion region 103 is transmitted to the gate of the MOS transistor 106.

The MOS transistor 105 is an example of the first reset unit, and is a reset transistor which sets the voltage of the gate of the MOS transistor 106 to a voltage VRST.

The MOS transistor 107 is a row selection transistor which transmits, to the vertical common signal line 108, the voltage obtained from the MOS transistor 106 according to the voltage of the floating diffusion region 103.

The MOS transistors 110, 112, 113, 114, 115, and 116, and the capacitors 111, 117, 118, 119, and 120 are included in the noise canceling circuit.

Enclosed by a dotted line is a pixel circuit 121 which is provided in each of a plurality of pixels arranged in an array in the solid-state imaging device.

Figure 4:
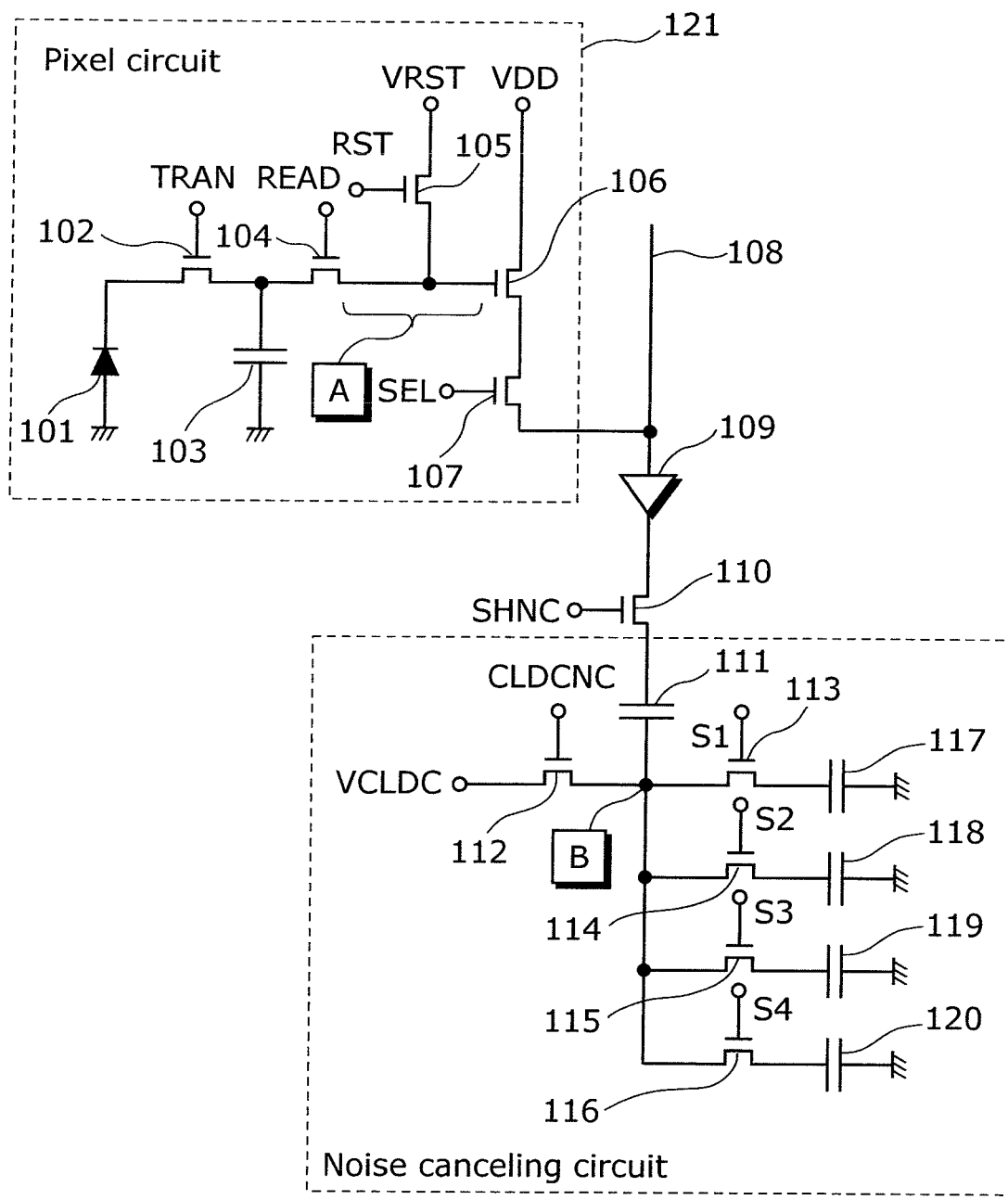
FIG. 4 is a circuit diagram showing a configuration of a main part of the solid-state imaging device according to a variation of the first embodiment of the present invention.

FIG. 4 is a circuit diagram showing a variation of the solid-state imaging device. In the solid-state imaging device according to this variation, signals from the respective pixels are transmitted to the vertical common signal line 108, and are subsequently amplified by the amplifier 109 and transmitted to the noise canceling circuit. In other aspects, the same is applicable as described above.

Figure 5:
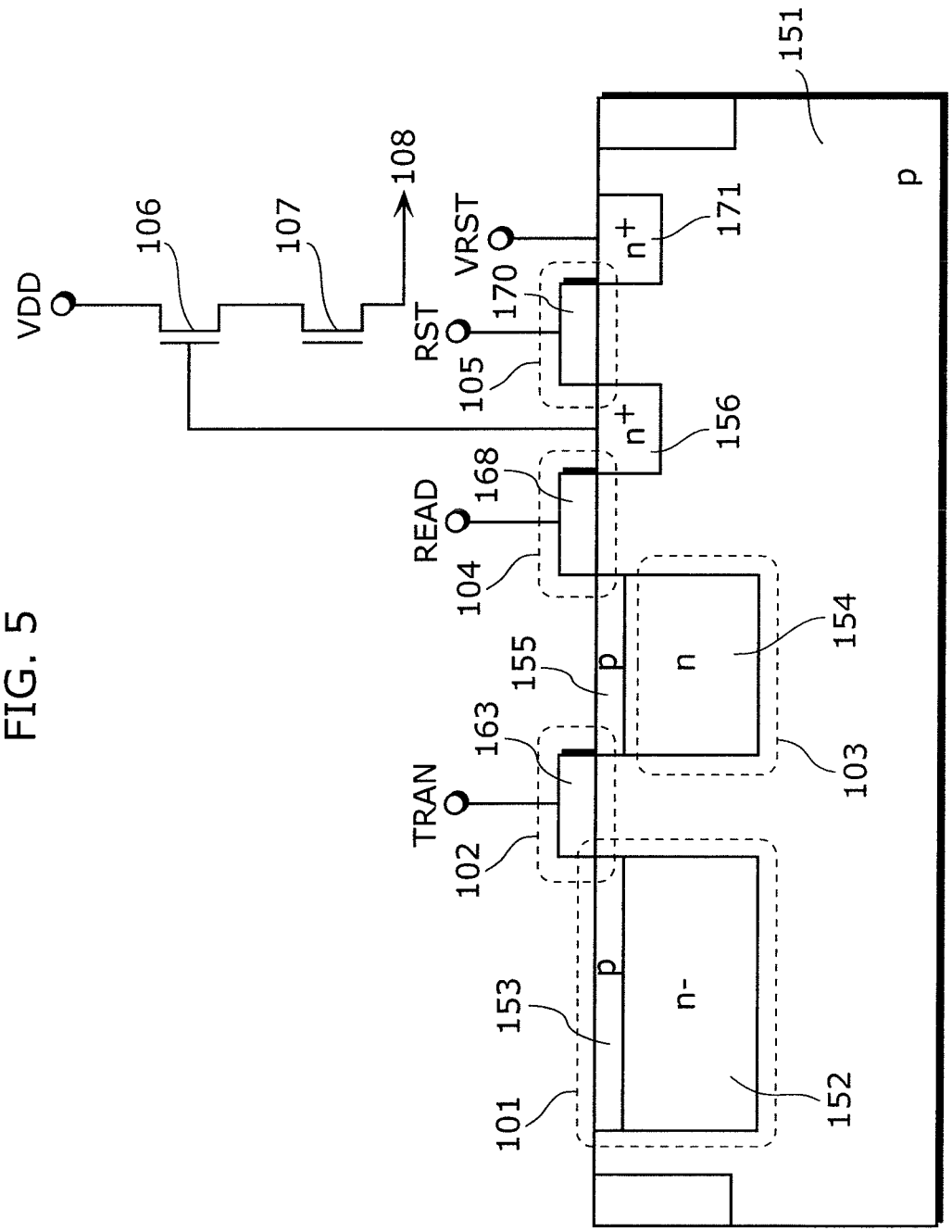
FIG. 5 is a cross-sectional schematic diagram of a pixel circuit according to the first embodiment of the present invention.

FIG. 5 is a cross-sectional schematic diagram of a main part of the pixel circuit 121.

As the photodiode 101, an $n^-$-type impurity region 152 is provided in a substrate 151 including a p-type semiconductor, and a p-type impurity region 153 is provided on the $n^-$-type impurity region 152, in a surface of the substrate 151. In addition, a lateral and bottom perimeter of the $n^-$-type impurity region 152 is surrounded by a p-type impurity region.

This prevents the charge, which is generated at a point having a factor causing leakage current, that is, having many defects in the surface of the substrate 151, from being accumulated in the photodiode 101, thus increasing sensitivity.

In addition, as the floating diffusion region 103, an n-type impurity region 154 is provided in the substrate 151, and a p-type impurity region 155 is provided on the n-type impurity region 154, in the surface of the substrate 151. This prevents the charge, which is generated at a point having a factor causing leakage current, that is, having many defects in the surface of the substrate 151, from being accumulated in the floating diffusion region 103, thus allowing securing a sufficient amount of charge to be accumulated in the floating diffusion region 103 as signal charges.

The MOS transistor 102 is formed to include: the n⁻-type impurity region 152, the n-type impurity region 154, and a gate electrode 163. By applying voltage to the gate electrode 163 of the MOS transistor 102, it is possible to transfer all the charge accumulated in the photodiode 101 to the floating diffusion region 103.

The MOS transistor 104 is formed to include: the n-type impurity region 154, an n⁺-type impurity region 156, and a gate electrode 168. By applying voltage to the gate of the MOS transistor 104, the voltage of the floating diffusion region 103 is transmitted to the gate of the MOS transistor 106 via the n⁺-type impurity region 156 and a contact not shown in the figure.

The MOS transistors 106 and 107 apply, to the vertical common signal line 108, a voltage according to the voltage of the floating diffusion region 103.

The MOS transistor 105 is formed to include: the n⁺-type impurity region 156, an n⁺-type impurity region 171, and a gate electrode 170.

In this configuration, the n⁻-type impurity region 152 is formed at a concentration of 1E13 to 1E16/cm³; the n-type impurity region 154 is formed at a concentration of 1E14 to 1E18/cm³; and the n⁺-type impurity region 156 is formed at a concentration of 1E15 to 1E20/cm³. In addition, the p-type impurity regions 153 and 155 are formed at a concentration of 1E15 to 1E20/cm³. Note that generally, increasing the level of impurity concentration increases leakage current, and thus the n-type impurity region 154 as the floating diffusion region 103 should preferably be formed at low concentration.

In addition, the configuration is designed such that the capacitance of the floating diffusion region 103 is, for example, three times or more larger than the capacitance of the photodiode 101, by, for example, increasing the area of the n-type impurity region 154, increasing the level of impurity concentration, or increasing the voltage to be applied. This, for example, makes it possible to transfer, to the floating diffusion region 103, all the charges of respective amounts accumulated in the photodiode 101 during three types of accumulation time having different lengths and to add the transferred charges, thus allowing expanding the dynamic range of the pixel circuit as described in detail below.

An operation of the solid-state imaging device configured as above will be described.

Figure 6:
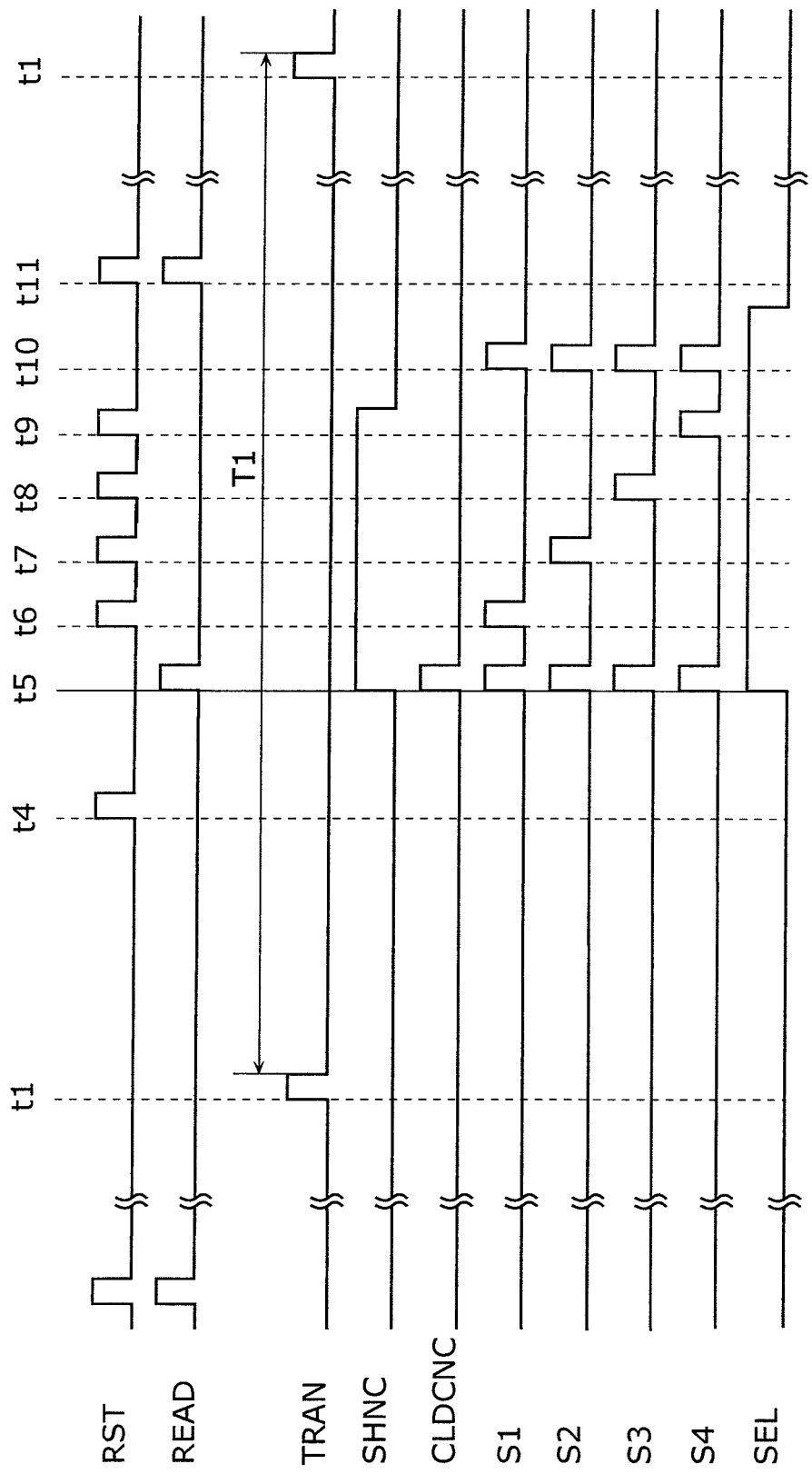
FIG. 6 is a timing chart for driving the solid-state imaging device according to the first embodiment of the present invention.

FIG. 6 is a timing chart indicating an example of timing for driving the solid-state imaging device.

RST is a control signal applied to the gate of the MOS transistor 105; READ is a control signal applied to the gate of the MOS transistor 104 as a switch; TRAN is a control signal applied to the gate of the MOS transistor 102 as a transferer; SHNC is a control signal applied to the gate of the MOS transistor 110; CLDCNC is a control signal applied to the gate of the MOS transistor 112; S1, S2, S3, S4 are control signals applied to gates of the MOS transistors 113, 114, 115, and 116, respectively; and SEL is a control signal applied to the gate of the MOS transistor 107.

At time point t1, the charge generated in the photodiode 101 during accumulation time T1 by turning on the MOS transistor 102 in the transferer is transferred to the floating diffusion region 103. This operation is performed almost simultaneously in all pixels.

At time point t4, the control signal RST is applied to the gate of the MOS transistor 105, so as to set, to VRST, a voltage of a partial circuit A shown in FIG. 3, which includes the gate of the MOS transistor 106.

Subsequently, at time point t5, the control signals READ, SEL, SHNC, CLDCNC, S1, S2, S3, and S4 are applied. The MOS transistor 104, to which the control signal READ is applied, turns on and transmits the voltage of the floating diffusion region 103 to the gate of the MOS transistor 106. A voltage VSIG, which is a result of dividing the charge transferred from the photodiode 101 at time point t1 by the capacitance of the floating diffusion region 103, is transmitted to the gate of the MOS transistor 106. In practice, since the partial circuit A includes a floating capacitor, a voltage resulting from voltage division between the floating diffusion region 103 and the floating capacitor is transmitted.

The MOS transistor 107, to which the control signal SEL is applied, turns on and transmits, to the vertical common signal line 108, the voltage that is output from the MOS transistor 106. The MOS transistor 110, to which the control signal SHNC is applied, turns on and transmits a voltage VSIG1 according to VSIG to an upper electrode (which represents an electrode shown in an upper side in the figure; hereinafter, each electrode is described as an upper electrode or a lower electrode, depending on the position at which it is shown in the figure) of the capacitor 111. In addition, the MOS transistor 112, to which the control signal CLNCDC is applied, turns on and transmits a voltage VCLDC to a lower electrode of the capacitor 111. At this point, the capacitor 111 is charged, so that the voltage across the capacitor 111 becomes (VSIG1−VCLDC). In addition, by turning on the MOS transistors 113, 114, 115, and 116 by applying the control signals S1, S2, S3, and S4, the capacitors 117, 118, 119, and 120 are initialized to the voltage VCLDC.

At time point t6, the control signal RST is applied to the gate of the MOS transistor 105, and the control signal S1 is applied to the gate of the MOS transistor 113, so that the partial circuit A is set to the voltage VRST. That is, the voltage of the partial circuit A which is VSIG at time point t5 becomes VRST at time point t6.

As a result, the voltage of the upper electrode of the capacitor 111, which is VSIG1 at time point t5, is changed to VRST0 at time point t6 according to VRST, so that a voltage (VSIG1−VCLDC−VRST0) is set for the capacitor 117. In addition, for the sake of conciseness, assuming that the capacitance of the capacitor 111 is sufficiently larger than the capacitance of one of the capacitors 117 to 120, the voltage (VSIG1−VCLDC−VRST0) is set for each of the capacitors 118, 119, and 120 at time points t7, t8, and t9 as the time point t6.

At time point t10, the control signals S1, S2, S3, and S4 are applied to the MOS transistors 113, 114, 115, and 116, respectively, and the capacitors 117, 118, 119, and 120 are connected in parallel. In FIG. 3, a voltage at point B with reference to VCLDC is (VSIG1−VCLDC−VRST0)+VCLDC, and a voltage (VSIG1−VRST0) is read out as a video signal.

Thus, by transferring, at time point t1, the charge generated in the photodiode 101 to the floating diffusion region 103 in all the pixels almost at the same time, the photodiodes in all the pixels start and stop accumulating charge at the same time, thus allowing a global shutter operation.

Figure 7:
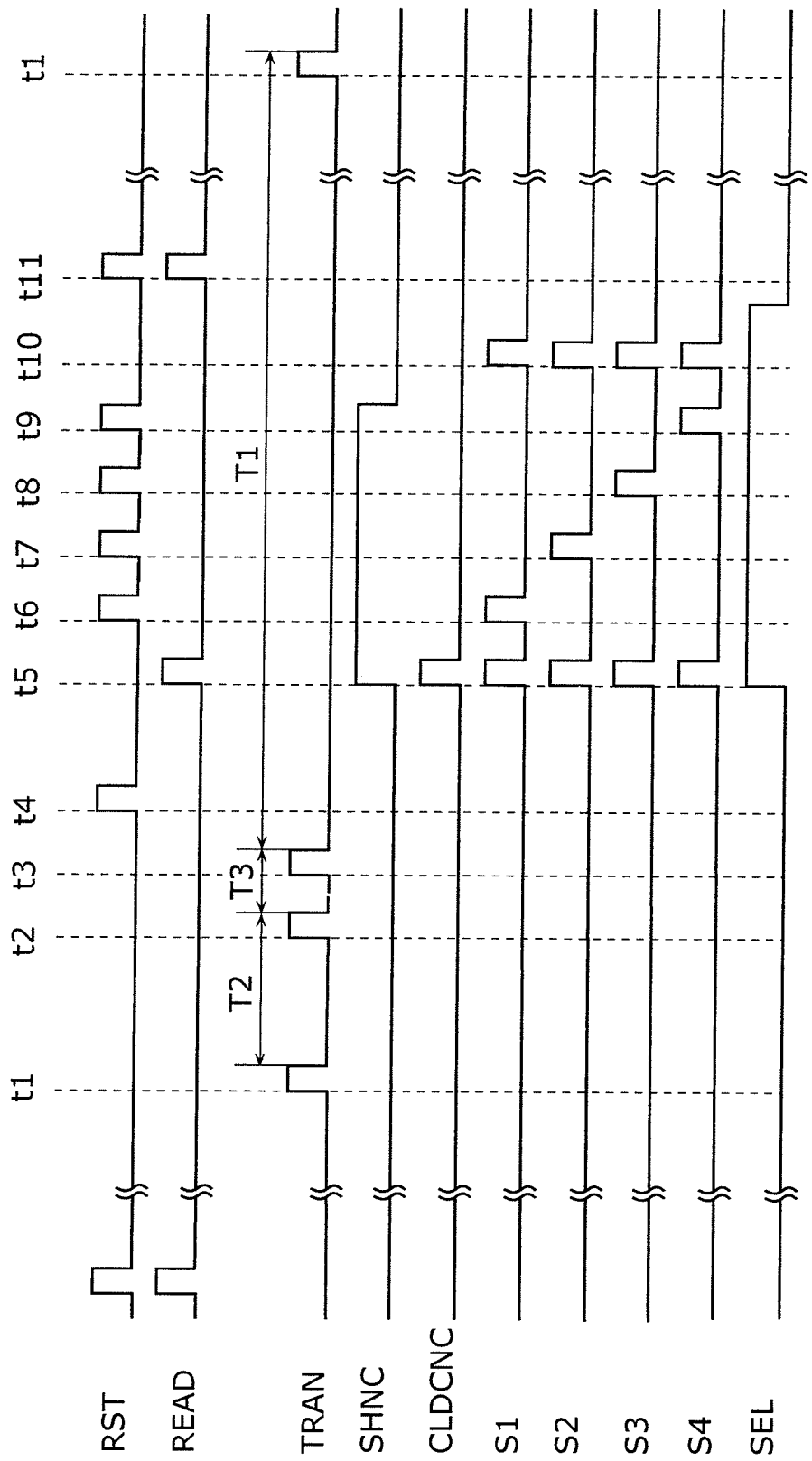
FIG. 7 is a timing chart for driving the solid-state imaging device according to the first embodiment of the present invention.

FIG. 7 is a timing chart indicating an example of timing for driving the solid-state imaging device.

The respective control signals except the control signal TRAN are the same as those in FIG. 6. The difference is that at time points t2 and t3 in addition to the time point t1, the control signal IRAN is changed to high level with a pulse shape. With this, three types of accumulation time T1, T2, and T3 are provided for accumulating charge in the photodiode 101 in each pixel. The lengths of accumulation time T1, T2, and T3 are different from each other, and when, for example, assuming the accumulation time T1 as 30 msec as a reference, the accumulation time T2 as 300 μsec, and the accumulation time T3 as 3 μsec, the accumulation time T2 having a hundredth (1/100) length of the reference accumulation time T1 and the accumulation time T3 having a ten-thousandth (1/10000) length of the reference are provided.

Since the output (amount of charge to be generated) from the photodiode 101 is proportional to a production of multiplication of incident light intensity and accumulation time, the intensity of the incident light that allows an output to be responsive without saturation is increased by 100 times when the accumulation time is 1/100, and is increased by 10000 times when the accumulation time is 1/10000.

As a result, each of (i) an amount of signal charge that has responded, at time point t1, to the incident light having an intensity up to the reference intensity, (ii) an amount of signal charge that has responded, at time point t2, to the incident light having an intensity up to 100 times higher than the reference, and (iii) an amount of signal charge that has responded, at time point t3, to the incident light having an intensity up to 10000 times higher than the reference, is transferred to the floating diffusion region 103 and added therein, so that at time point t3, the floating diffusion region 103 holds an amount of charge that has responded to the incident light having an intensity up to 10000 times larger than the reference.

This means that the dynamic range of the pixel circuit is expanded by 80 dB (20*log(10000)). Accordingly, when setting a reference dynamic range to a general range of 60 dB, a dynamic range of 140 dB can be obtained.

As shown in FIG. 7, an operation at the time point t4 and after is the same as the operation shown in FIG. 6, which allows the global shutter operation and further allows obtaining a video signal having expanded dynamic range. In the example in FIG. 7, three types of accumulation time have been used for description, but the ratio between each accumulation time and the number of the types are not limited to this example.

According to the solid-state imaging device configured as above, it is possible to produce advantageous effects as below.

For a first advantageous effect, when assuming different lengths of accumulation time as T1, T2, and T3, by setting the accumulation time T1 to 30 msec as the reference, the accumulation time T2 to 300 μsec, and the accumulation time T3 to 3 μsec, the output during the accumulation time of 300 μsec that is a hundredth (1/100) of the reference accumulation time T1 and the output during the accumulation time of 3 μsec that is a ten-thousandth (1/10000) of the reference are added to the accumulation time T1, thus allowing achieving dynamic range 10000 times larger than the reference. Note that in this example, three types of accumulation time have been used for the description, but the application is not limited to these three types; it is possible to produce the same advantageous effect using a combination of a normal accumulation time and a shorter accumulation time.

Figure 8:
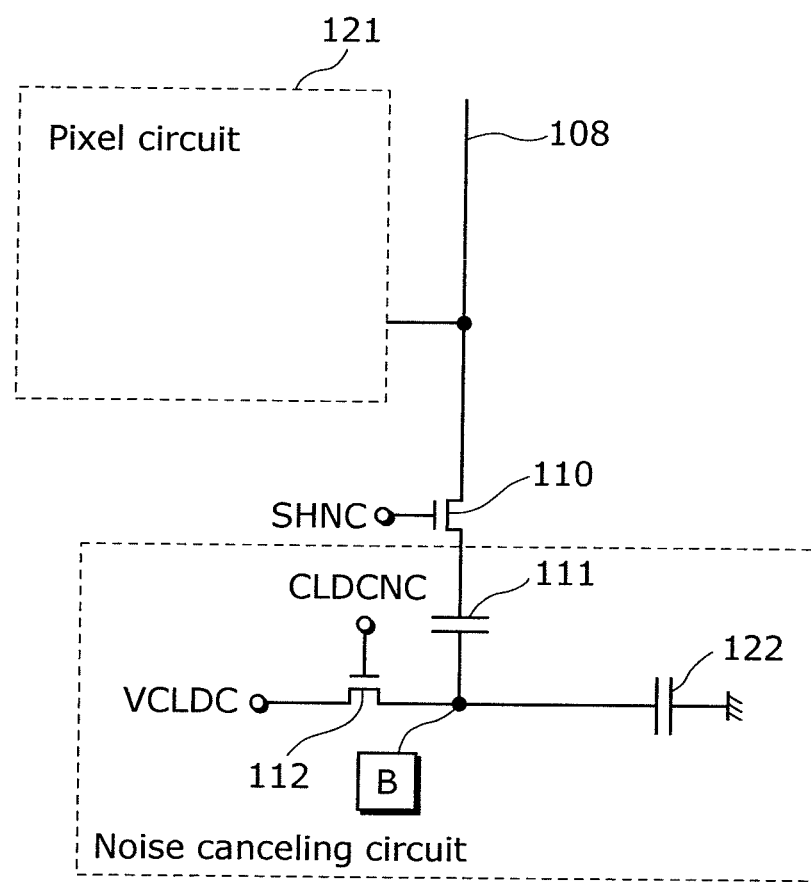
FIG. 8 is a circuit diagram showing a general noise canceling circuit.

A second advantageous effect allows obtaining a higher voltage at point B than in the case of a general noise canceling circuit including two capacitors, that is, capacitors 111 and 122 as shown in FIG. 8. This advantageous effect can be produced by including, as shown in FIG. 3, the capacitor 111 and the capacitors 117, 118, 119, and 120 in the noise canceling circuit.

As a specific example, assuming the capacitance of the capacitor 111 as 3 pF and the capacitance of the capacitor 122 as 2 pF, the voltage obtained at point B is 0.6 times (3 pF/(3 pF+2 pF)) as high as the voltage obtained from the vertical common signal line 108. In contrast, according to an implementation of the present invention, it is possible to obtain, at point B, a voltage that is 0.86 times (3 pF/(3 pF+0.5 pF)) as high as the voltage obtained from the vertical common signal line 108, by dividing the capacitor 122 into the four capacitors 111, 118, 119, and 120, and setting the capacitance of each of the capacitors 117, 118, 119, and 120 to 0.5 pF that is a quarter (¼) of the capacitance 2 pF of the capacitor 122, thus allowing increasing an output voltage by 43% compared to the general case of not dividing the capacitor.

A third advantageous effect is noise reduction. Since the capacitors 117, 118, 119, and 120 are connected in parallel at time point t11 after the voltage VRST1 is set for the capacitors 117, 118, 119, and 120, it is possible to reduce ktc noise to ½ (1/√4).

[Embodiment 2]

Subsequently, a solid-state imaging device according to a second embodiment of the present invention will be described.

Figure 9:
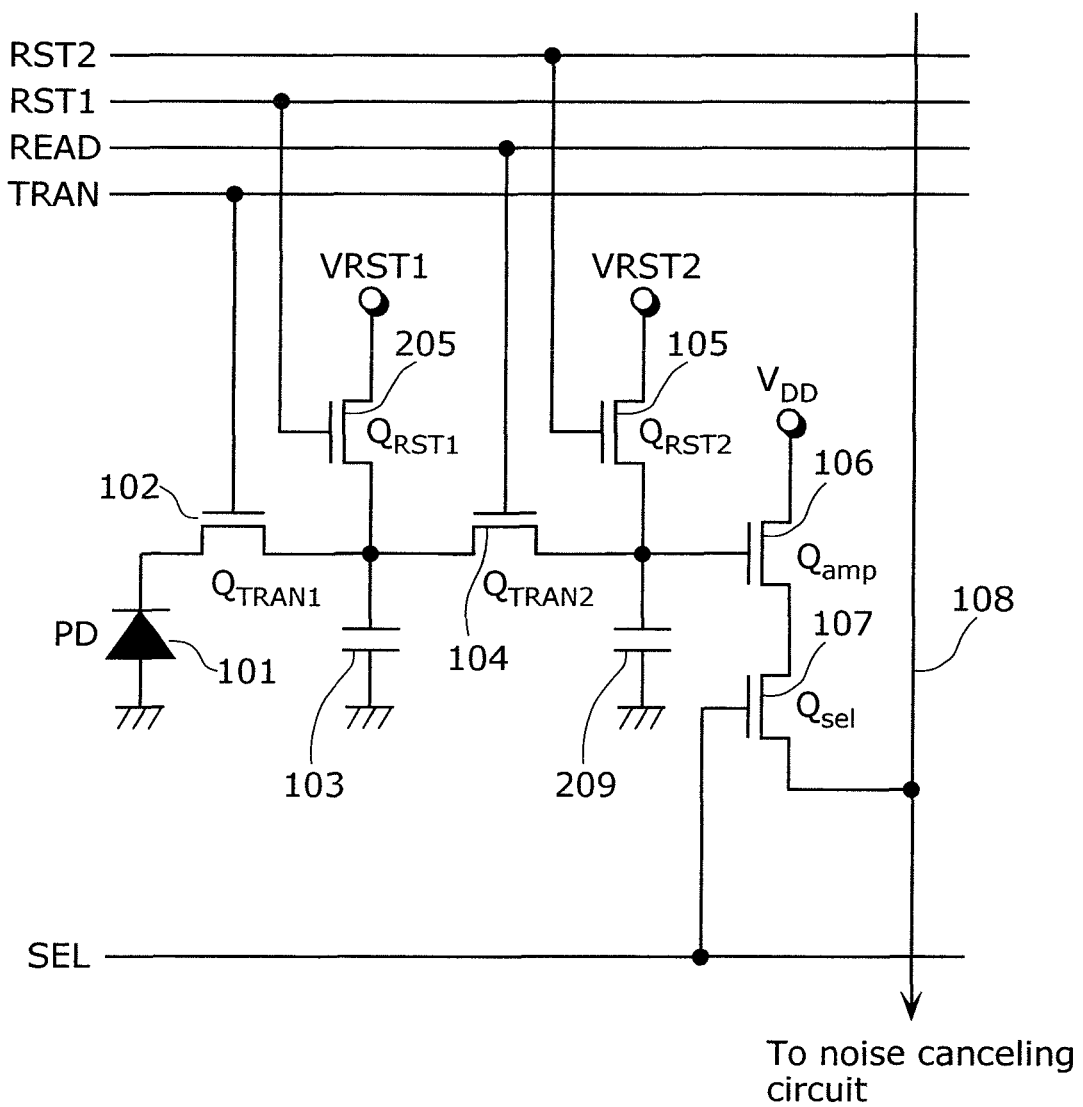
FIG. 9 is a circuit diagram showing a pixel circuit of a solid-state imaging device according to a second embodiment of the present invention.

FIG. 9 is a circuit diagram showing a pixel circuit of the solid-state imaging device according to the second embodiment of the present invention.

Compared to the pixel circuit 121 in the solid-state imaging device according to the first embodiment shown in FIG. 3, the pixel circuit shown in FIG. 9 includes, additionally, a MOS transistor 205 and a control signal RST1, with an explicit illustration of a floating diffusion region 209 in the partial circuit A in FIG. 3.

The MOS transistor 205 is an example of a second reset unit, and is a reset transistor which sets the voltage of the floating diffusion region 103 to an initializing voltage VRST1.

Note that in FIG. 9, a control signal RST2 and a voltage VRST2 are the same as the control signal RST and the voltage VRST in FIG. 3, respectively. In addition, FIG. 9 explicitly shows a signal line that transmits each control signal, but the illustration of each power line supplying a corresponding one of the voltages VRST1, VRST2, and VDD is omitted.

Figure 10:
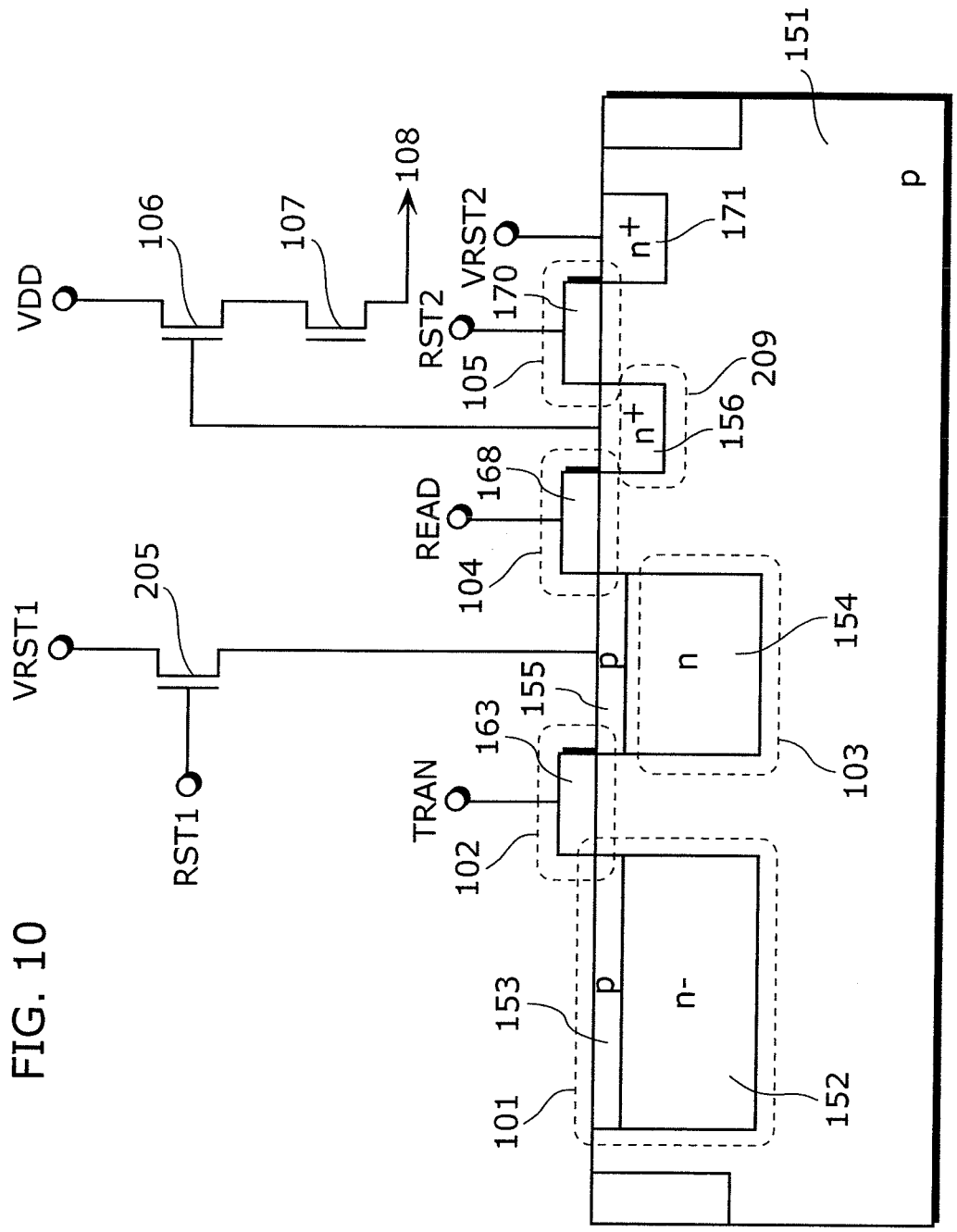
FIG. 10 is a cross-sectional schematic diagram of a pixel circuit according to the second embodiment of the present invention.

FIG. 10 is a cross-sectional schematic diagram of a main part of the pixel circuit according to the second embodiment.

In FIG. 10, the n⁺-type impurity region 156 functions as the floating diffusion region 209. In addition, the MOS transistor 104 functions as a charge transfer gate (that is, a single-stage charge transfer element) through which the charge accumulated in the floating diffusion region 103 is transferred to the floating diffusion region 209.

By applying voltage to the gate of the MOS transistor 104, all the charges accumulated in the floating diffusion region 103 are transferred to the floating diffusion region 209 and accumulated therein. A voltage generated by the accumulated charge in the floating diffusion region 209 is applied to the gate of the MOS transistor 106 via a contact not shown in the figure.

The MOS transistors 106 and 107 apply, to the vertical common signal line 108, a voltage according to the voltage of the floating diffusion region 209.

Here, the voltage VRST1 applied to the floating diffusion region 103 may be lower than the voltage VRST2 applied to the is floating diffusion region 209. This allows a complete transfer of the charge from the floating diffusion region 103 to the floating diffusion region 209.

The impurity concentration of each of the impurity regions shown in FIG. 10 is the same as the impurity concentration described in FIG. 5.

As described earlier, in order to suppress leakage current, it is preferable that the n-type impurity region 154 as the floating diffusion region 103 be formed at low concentration.

In contrast, a contact connected to the gate of the MOS transistor 106 is provided in the n$^+$-type impurity region 156 as the floating diffusion region 209; accordingly, it is possible, by increasing the n$^+$-type impurity concentration, to prevent a depletion region from spreading to the surface of the substrate 151 even when voltage is applied, thus reducing leakage current. In addition, by forming the n$^+$-type impurity region 156 at high concentration, it is possible to increase the capacitance of the floating diffusion region 209 and to thereby increase the amount of charge accumulation.

Figure 11:
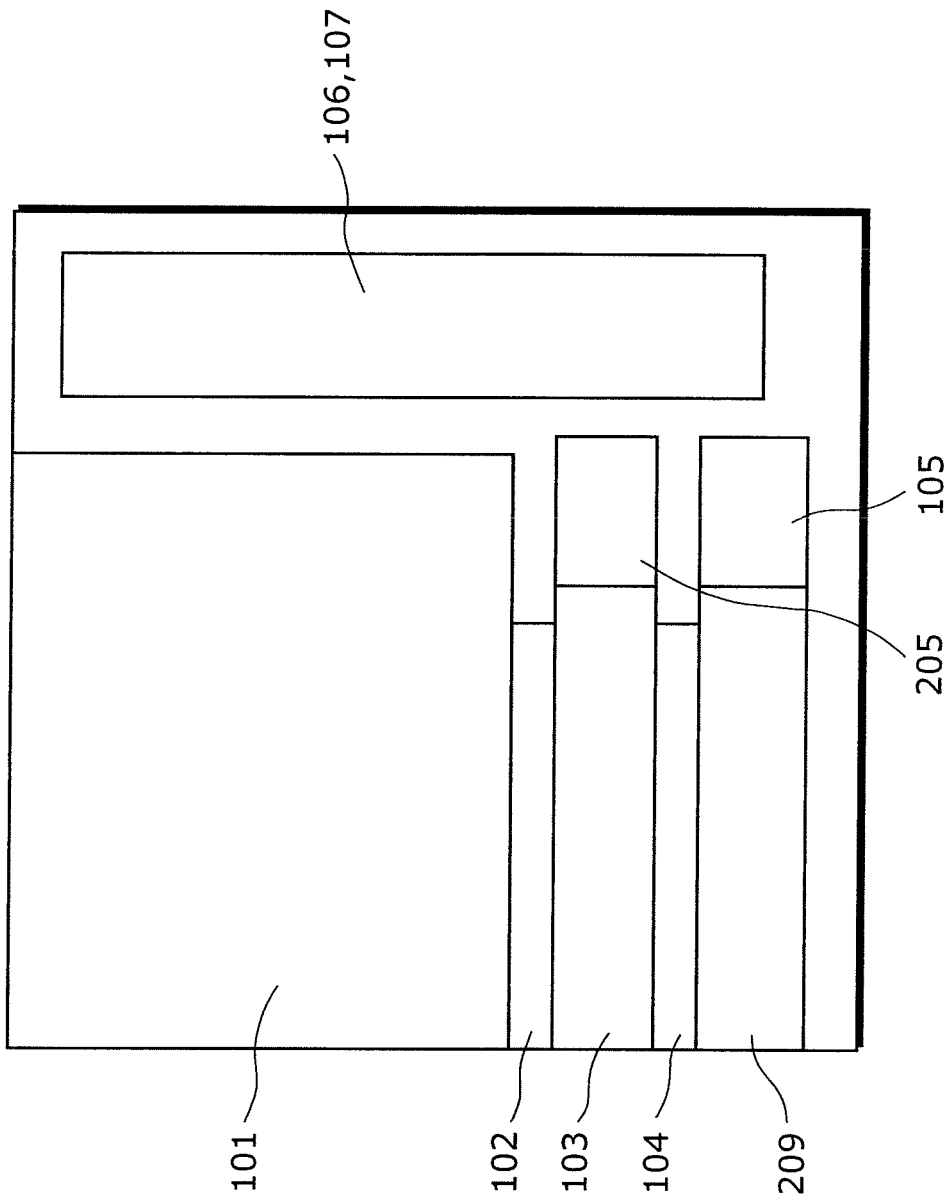
FIG. 11 is a layout diagram of the pixel circuit according to the second embodiment of the present invention.

FIG. 11 is a schematic diagram showing a basic layout of the pixel circuits according to the second embodiment as viewed from top of the substrate.

In this pixel circuit, from top left to bottom, the photodiode 101, the MOS transistor 102, the floating diffusion region 103, the MOS transistor 104, and the floating diffusion region 209 are arranged adjacent to each other in this order. In addition, the MOS transistor 205 is placed adjacent to the floating diffusion region 103 on the right in the figure, and the MOS transistor 105 is placed adjacent to the floating diffusion region 209 on the right in the figure. In addition, the MOS transistors 106 and 107 are placed to the right of the photodiode 101 in the figure. In addition to these, as signal lines and power lines, seven to nine lines are placed although not shown in the figure.

According to the layout as above, the n-type impurity region 154 is shared between the drain of the MOS transistor 102 and the floating diffusion region 103, and the n$^+$-type impurity region 156 is shared between the drain of the MOS transistor 104 and the floating diffusion region 209, thus substantially reducing area to be occupied by the capacitor when viewed from top of the substrate. As a result, the photodiode 101 can secure a high aperture ratio that is a ratio of area occupied by the photodiode 101 in an area of one pixel.

When it is important to increase the aperture ratio, the voltages VRST1 and VRST2 described earlier may be supplied as the same voltage using a single power line. Furthermore, the voltages VRST1, VRST2, and VDD may be supplied as the same voltage using the single power line.

As an example, when assuming a cell size of one pixel as 5.6 μm×5.6 μm and using a 0.25-μm CMOS rule, a line covers approximately 5% of the area of the cell of one pixel; when assuming, for example, a reference aperture ratio in the case of not sharing the power line as 30%, the aperture ratio is increased to 35% by reducing one of the power lines, and can further be increased to 40% by reducing another one of the power lines.

In addition, since the pixel circuit accumulates signal charge using the floating diffusion regions 103 and 209, it is possible to realize a pixel circuit which allows expanding dynamic range, using a simple configuration which, for example, does not include a MOS-type capacitor for accumulating signal charge.

Note that the p-type impurity regions 153 and 155 in the surface of the substrate 151 in the floating diffusion regions 103 and 209 are provided, as described earlier, to suppress leakage current in and out of the floating diffusion regions 103 and 209; thus, p-type impurity regions 153 and 155 can be omitted from the configuration intended to expand dynamic range of the pixel circuit.

An imaging device includes a plurality of such pixel circuits arranged in an array.

An operation of the solid-state imaging device configured as above will be described.

Figure 12:
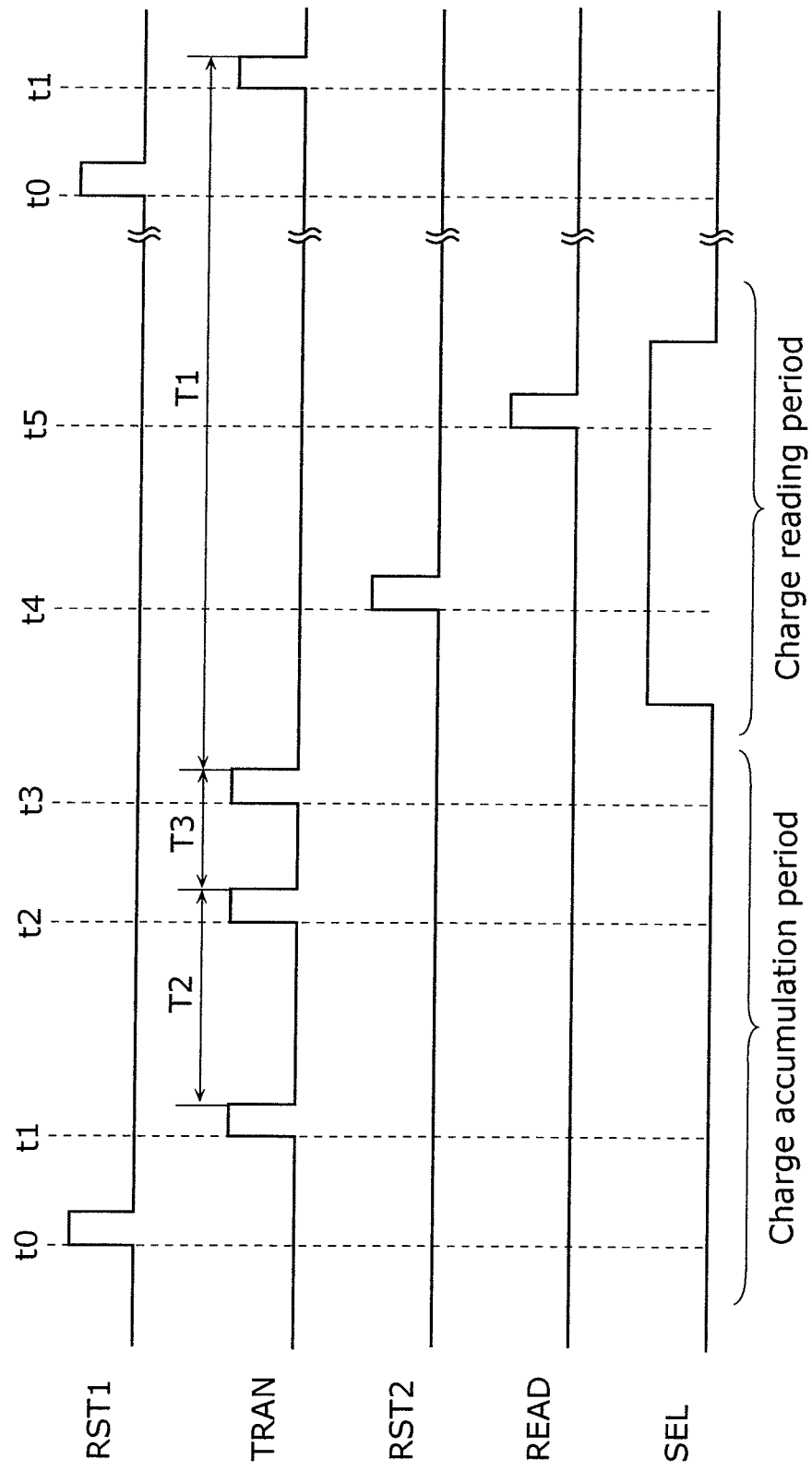
FIG. 12 is a timing chart for driving the solid-state imaging device according to the second embodiment of the present invention.

FIG. 12 is a timing chart showing an example of timing for driving the pixel circuit of the solid-state imaging device according to the second embodiment.

A basic concept of driving timing as shown in FIG. 12 is the same as the driving timing shown in FIG. 7 in that: all the amounts of charge accumulated in the photodiode 101 during three types of accumulation time having different lengths are transferred to the floating diffusion region 103 and added therein, so as to expand dynamic range.

The following will omit the description of the points common to the driving timing in FIG. 7, and will only describe the difference. Note that the control signal RST2 corresponds to the control signal RST in FIG. 7 as described earlier.

First, during the charge accumulation period, an operation of transferring, to the floating diffusion region 103, the charge accumulated in the photodiode 101 through photoelectric conversion will be performed.

At time point t0, by changing the control signal RST1 to high level with a pulse shape, the charge accumulated in the floating diffusion region 103 is discharged to a supply of the voltage VRST1 via the MOS transistor 205.

At time points t1, t2, and t3, as in FIG. 7, by changing the control signal TRAN to high level with a pulse shape, each amount of charge accumulated in the photodiode 101 during different types of accumulation time T1, T2, and T3 is transferred to the floating diffusion region 103 and added therein. As described in the first embodiment, this expands the dynamic range.

Subsequently, during the charge reading period, an operation of transmitting a signal to the vertical common signal line 108 is performed.

With the control signal SEL held at high level, the control signal RST2 is changed to high level with a pulse shape at time point t4. With this, a voltage according to the voltage VRST2 is set for the floating diffusion region 209 via the MOS transistor 105.

The MOS transistors 106 and 107 apply, to the vertical common signal line 108, a voltage according to the voltage set for the floating diffusion region 209, and a noise canceling unit not shown in the figure holds the voltage obtained from the vertical common signal line 108 as noise voltage that is to be subsequently offset by the signal voltage. For the noise canceling unit, for example, a general circuit as shown in FIG. 8 may be used, or the circuit shown in FIG. 3 may also be used.

At time point t5, the control signal READ is changed to high level with a pulse shape. This causes the electric charge accumulated in the floating diffusion region 103 to be transferred to the floating diffusion region 209 via the MOS transistor 104. The voltage of the floating diffusion region 209 changes according to the amount of the transferred charge (that is, an amplitude of the signal component).

The MOS transistors 106 and 107 apply, to the vertical common signal line 108, a voltage according to the changed voltage of the floating diffusion region 209, and the noise canceling unit holds the voltage obtained from the vertical common signal line 108 as a voltage including a noise component and a signal component.

The noise canceling unit detects a difference between a previously-held voltage and a subsequently-held voltage as a signal component.

In the case of using the general circuit in FIG. 8 for the noise canceling unit, the signal component is detected as an amount of change from the voltage VCLDC at point B. In addition, the method of detecting the signal component in the case of using the circuit shown in FIG. 3 for the noise canceling unit has been described in the first embodiment.

Such a noise canceling operation also removes variation in the threshold of the MOS transistor 106 in each pixel, thus making it possible to obtain a highly-sensitive and high-quality image.

According to the solid-state imaging device configured as above, it is possible to produce an advantageous effect as below.

By concurrently performing the operation during the charge accumulation on a plurality of pixels arranged in an array in the solid-state imaging device, the photodiodes in all the pixels start and stop accumulating charge at the same time, thus allowing a global shutter operation. The operation during the charge reading period is sequentially performed per row, for example, on each pixel in each row in the array during a horizontal blanking period for the row.

In addition, all the amounts of charge accumulated in the photodiode 101 during the three different types of accumulation time are completely transferred to the floating diffusion region 103 and added therein, thus making it possible to expand the dynamic range of the pixel circuit.

[Industrial Applicability]

An imaging element according to an implementation of the present invention is widely applicable to a digital camera, a mobile information terminal device, an in-vehicle camera, a monitoring camera, and so on.

[Reference Signs List]

101 Photodiode
102, 104, 105, 106, 107, 110, 112, 113, 114, 115, 116, 205 MOS transistor
103, 209 Floating diffusion region
108 Vertical common signal line
109 Amplifier
111, 117, 118, 119, 120, 122 Capacitor
121 Pixel circuit
151 Substrate
152 n⁻-type impurity region
153, 155 p-type impurity region
154 n-type impurity region
156, 171 n⁺-type impurity region
163, 168, 170 Gate electrode
371 PD unit
372 Transfer transistor
373 FD region
374 First capacitor
375 Second capacitor
376 Reset transistor
377 First accumulation transistor
378 Second accumulation transistor
379 Amplifying transistor
380 Selection transistor

The invention claimed is:

1. A solid-state imaging device including a plurality of pixel circuits two-dimensionally arranged on a semiconductor substrate, said solid-state imaging device comprising:
a photoelectric conversion unit configured to generate a charge from incident light;
a first transfer unit connected to said photoelectric conversion unit and configured to transfer the charge;
a first accumulation unit configured to accumulate the charge via said first transfer unit;
a second transfer unit connected to said first accumulation unit and connected in series to said first transfer unit;
an output unit configured to output a signal voltage that is a voltage according to an amount of the charge via said second transfer unit; and
a reset unit configured to set a voltage of a connection point between said second transfer unit and said output unit to a reset voltage,
wherein said output unit is configured to output a reference voltage in a state where the reset voltage is applied to the connection point,
said photoelectric conversion unit generates a first charge while the incident light enters said photoelectric conversion unit during a first accumulation time within a first frame period,
said photoelectric conversion unit generates a second charge while the incident light enters said photoelectric conversion unit during a second accumulation time within the first frame period,
the first accumulation time is different from the second accumulation time,
the first transfer unit is configured to transfer the first charge and the second charge to the first accumulation unit,
said first accumulation unit is configured to add and accumulate the first charge and the second charge, and
only one picture is generated during the first frame period based on the first charge and the second charge accumulated by the first accumulation unit.

2. The solid-state imaging device according to claim 1, further comprising
a differential circuit which detects a difference between the signal voltage and the reference voltage,
wherein said differential circuit includes:
a first capacitor and a second capacitor that are connected in series; and
an initializing switch through which an initializing voltage that is predetermined is applied to a connection point between said first and second capacitors, and
in a state where the initializing voltage is applied to the connection point, said differential circuit holds a difference voltage in said first capacitor and the initializing voltage in said second capacitor, and subsequently divides the reference voltage between said first and second capacitors, the difference voltage being a difference between the signal voltage and the initializing voltage.

3. The solid-state imaging device according to claim 1,
wherein each of said first and second transfer units includes a MOS transistor, and
a drain of said first transfer unit is connected to a source of said second transfer unit.

4. The solid-state imaging device according to claim 1,
wherein said photoelectric conversion unit, said first transfer unit, said first accumulation unit, said second transfer unit, said output unit, and said reset unit are provided in each of said plurality of pixel circuits.

5. The solid-state imaging device according to claim 1, wherein said second transfer unit includes a MOS transistor.

6. The solid-state imaging device according to claim 1, wherein said first accumulation unit has no contact with a metal material.

7. The solid-state imaging device according to claim 1,
wherein the first accumulation unit includes a first region of a first conductivity type and a second region having a second conductivity type different from the first conductivity type, and
the second region is disposed on the first region.

8. The solid-state imaging device according to claim 2,
wherein said second capacitor includes a plurality of separate capacitors one of which can be selectively connected in series to said first capacitor, and all of which can be coupled in parallel, and
said differential circuit divides the reference voltage between said first capacitor and each of said plurality of separate capacitors, and subsequently couples all of said plurality of separate capacitors in parallel.

9. The solid-state imaging device according to claim 7,
wherein the photoelectric conversion unit includes a third region of the first conductivity type and a fourth region of the second conductivity type,
the fourth region is disposed on the third region, and
an impurity concentration of the first conductivity type in the first region is higher than an impurity concentration of the first conductivity type in the third region.

\* \* \* \* \*